US006023185A

United States Patent [19]

Galipeau et al.

[11] Patent Number: 6,023,185

[45] Date of Patent: Feb. 8, 2000

[54] TEMPERATURE COMPENSATED CURRENT REFERENCE

[75] Inventors: Denis P. Galipeau, Woonsocket; Christopher J. Sanzo, Providence, both of R.I.

[73] Assignee: Cherry Semiconductor Corporation, East Greenwich, R.I.

[21] Appl. No.: 08/803,900

[22] Filed: Feb. 21, 1997

Related U.S. Application Data

[60] Provisional application No. 60/015,659, Apr. 19, 1996.

[51] Int. Cl.[7] .................... H01L 35/00

[52] U.S. Cl. .................... 327/513; 327/512; 327/538; 323/315

[58] Field of Search .................... 327/513, 512, 327/530, 535, 538; 323/311, 315, 316

[56] References Cited

U.S. PATENT DOCUMENTS 4,691,262 9/1987 Chalfin .................... 361/56

4,945,259 7/1990 Anderson .................... 327/540

*Primary Examiner*—David Nelms

*Assistant Examiner*—Hoai V. Ho

*Attorney, Agent, or Firm*—Bromberg & Sunstein LLP

[57] ABSTRACT

A circuit for providing a temperature-compensated reference current, the circuit comprising a current mirror and a $V_{BE}$ multiplier circuit. The current mirror includes a reference transistor with its collector providing the temperature-compensated reference current. The $V_{BE}$ multiplier circuit connects together the base and collector of the reference transistor so as to provide a voltage differential in a range of values having a greatest lower bound equal to $V_{BE}$, and sinks (or supplies) base current to the reference transistor so that the reference current is not appreciably affected by the base current of the reference transistor.

12 Claims, 7 Drawing Sheets

TEMPERATURE COMPENSATED CURRENT REFERENCE

This application claims the benefit of U.S. Provisional Application No. 60/015,659, filed Apr. 19, 1996, the entire disclosure of which is hereby incorporated herein by reference.

FIELD OF THE INVENTION

The present invention relates to current reference circuits, and more particularly to current reference circuits providing a temperature-compensated reference current.

BACKGROUND OF THE INVENTION

In many circuits it is desirable to provide a temperature-compensated reference current from which other currents can be derived. The classic current mirror circuit with a "$V_{BE}$" circuit for temperature compensation is shown in FIG. 1*a*. A regulated voltage $V_{reg}$ is applied at terminal 10 to the emitters of transistors 15 and 20. Transistor 15 is configured as a diode with its base tied to its collector, and its collector current is denoted as the reference current $I_{ref}$. The collector current of transistor 20 is denoted as $I_1$, which is supplied to a load (passive or active). Provided transistors 15 and 20 are matched, there will be a prescribed relationship between $I_{ref}$ and $I_1$. For example, if the emitter areas of transistors 15 and 20 are equal, then ideally we have $I_1=I_{ref}$.

A "$V_{BE}$" circuit 25 and resistor 30 connect the collector of transistor 15 to ground. $V_{BE}$ circuit 25 may simply be one or more diodes providing a voltage drop of $NV_{BE}$, where N is an integer and $V_{BE}$ is the forward voltage drop of a diode. For simplicity, we will assume hereinafter that all diode forward voltage drops and transistor base-emitter voltage drops are equal to $V_{BE}$. Also, for simplicity of discussion, we will assume that the emitter areas of transistors 15 and 20 are equal to each other. Generalization of the following discussion for unequal emitter areas is obvious.

Ignoring the base currents of transistors 15 and 20, the reference current $I_{ref}$ will equal the current through circuit 25 and resistor 30, which we denote as the trim current $I_{trim}$. Then, the reference current is given by the simple relationship $L_{ref}=(V_{reg}-(N+1)V_{BE})R$, where R is the resistance of resistor 30. Thus, for a given N and $V_{reg}$, the resistor 30 sets the reference current $I_{ref}$, as well as $I_1$.

By proper choice of N, some degree of temperature compensation in the circuit of FIG. 1*a* can be achieved. For example, assume that $V_{reg}$ has no appreciable variation due to temperature, and that the temperature dependencies of $V_{BE}$ and R are known. Furthermore, assume that for a temperature T near a nominal temperature $T_0$, R is given by the linear function $R=R_0(1+k(T-T_0))$ where $R_0$ is the resistance of R at temperature $T=T_0$ and k is a thermal coefficient of resistance.

The derivative of $I_{ref}$ with respect to temperature T for the circuit of FIG. 1*a* for the above assumptions is given by $dI_{ref}/dT=-(dV_{BE}/dt)(N+1)/R-kR_0(V_{ref}-(N+l)V_{BE})/R^2$. Setting $dI_{ref}/dT=0$ in this expression at the nominal temperature $T_0$, and denoting the value of $V_{BE}$ at temperature $T_0$ as $V_0$, we obtain the following expression for N for which the circuit of FIG. 1*a* is properly temperature compensated: $N=V_{reg}/(V_0-(1/k)dV_{BE}/dt)-1$.

However, this expression will in general not be satisfied for N being an integer. One approach to achieve temperature compensation for a circuit of the type shown in FIG. 1*a* is simply to choose N=where denotes the closest integer to x. A more accurate solution would be to use the "$V_{BE}$ multiplier" circuit 25' as shown in FIG. 1*b* in place of circuit 25, in which case the voltage drop from the collector of transistor 15 to node 35 would be $V_{BE}(1+R_1/R_2)$, where $R_1$ and $R_2$ are the resistances of resistors 45 and 40, respectively. With the $V_{BE}$ multiplier circuit, the resistances of $R_1$ and $R_2$ are chosen so that $(1+R_1/R_2)=V_{reg}/(V_0-(1/k)dV_{BE}/dt)-1$.

However, even with the use of a $V_{BE}$ multiplier circuit, the above analysis for the circuit of FIG. 1*a* or 1*b* is still somewhat idealized. In practice, because transistors 15 and will not be exactly matched, emitter resistors would be used with transistors 15 and 20. Furthermore, often it is desirable to provide a number of mirrored currents, in which case a number of transistors would have their bases connected to the collector of transistor 15. However, with a number of transistors connected to transistor 15, the effect of the total base current cannot be ignored, and ;ef would no longer be sufficiently close to $I_{trim}$. In this case, it is well known in the art to use a "beta-helper" transistor, or buffer, to reduce the effect of the base current upon the relationship between $I_{ref}$ and $I_{trim}$. Thus, a more practical circuit for current mirroring used in the prior art is shown in FIG. 2, where, for example, we have included three transistors 20, 21, and 22 for providing the three currents $I_1$, $I_2$, and $I_3$, the emitter resistors 51, 52, 53, and 54, and the "beta-helper" transistor 50.

For the circuit of FIG. 2, if the base current of transistor 50 is ignored, then the reference current $I_{ref}$ is given by $I_{ref}=(V_{reg}-V_{BE}(3+R_1/R_2))/(R+R_e)$, where $R_e$ is the resistance of emitter resistor 51. For temperature compensation, the values of $R_1$ and $R_2$ can be chosen so that the derivative of $I_{ref}$ with respect to temperature is close to zero. However, this simplified analysis of the circuit in FIG. 2 is only approximately true, and the circuit of FIG. 2 suffers from variation in the mirrored currents $I_1$, $I_2$, and $I_3$ due to temperature. It should be noted that the previous expression for $I_{ref}$ is only approximately true because the base current of transistor 50 has been ignored. Furthermore, the base current of transistor 50 increases as more transistors such as transistors 20–22 are used to supply additional mirrored currents. The base current of transistor 50 could be ignored provided its beta value is high.

In addition to the problem of a small beta value of transistor 50, a potentially more serious problem with the prior art circuit of FIG. 2 is that the total voltage drop from $V_{reg}$ terminal 10 to node 35 must be $3V_{BE}$ or greater. This problem will limit the operation of the circuit of FIG. 2 to a regulated voltage source with a voltage at least as large as $RI_{trim}+3V_{BE}$, and it may not be possible to temperature compensate the reference current $I_{ref}$. This latter issue is best illustrated by writing the previous equation for $I_{ref}$ as $I_{ref}=(V_{reg}-xV_{BE})/r$, where $x=3+R_1/R_2$ and for simplicity we have lumped R and $R_e$ into r so that $r=R+R_e$. Taking the derivative of $I_{ref}$ with respect to temperature T(to first order the derivative of $R_1/R_2$ with respect to temperature is zero provided $R_1$ and $R_2$ have equal temperature coefficients) and setting the result equal to zero yields:

$$x\left[V_{BE}\left[\frac{1}{r}\frac{\partial r}{\partial T}\right]-\frac{\partial V_{BE}}{\partial T}\right]=V_{reg}\left[\frac{1}{r}\frac{\partial r}{T}\right].$$

However, depending upon the temperature thermal coefficient of the effective resistance r and the regulated voltage $V_{reg}$, the solution to the above equation may be less than three, i.e., $x<3$, which cannot be realized by the circuit of FIG. 2 because $x=3+R_1/R_2>3$. Thus, the circuit of FIG. 2 can provide a temperature compensated reference current only if $$\frac{V_{reg}\left[\frac{1}{r}\frac{\partial r}{\partial T}\right]}{\left[V_{BE}\left[\frac{1}{r}\frac{\partial r}{\partial T}\right]-\frac{\partial V_{BE}}{\partial T}\right]}>3.$$

Another temperature compensation scheme is illustrated by the circuit of FIG. 3. A regulated voltage $V_{reg}$ is applied at terminal 60 and a current is supplied to load 62. The current supplied to load 62 is set by the regulated voltage and by resistor 64. Provided the $V_{BE}$'s of transistors 66 and 68 are sufficiently matched, the current flowing through resistor 64 will be $V_{reg}/R_{64}$, where $R_{64}$ is the resistance of resistor 64. The current flowing through resistor 64 is mirrored by transistors 70 and 72. However, although the temperature variations in the base-emitter voltage drops of transistors 66 and 68 are canceled, resistor 64 will have a temperature variation, and therefore the current supplied to load 62 may not be sufficiently temperature compensated.

SUMMARY OF THE INVENTION

In an embodiment of the present invention, a current reference circuit for providing a reference current comprises a first reference node to receive a voltage; a current mirror coupled to the first reference node, where the current mirror includes a reference transistor in which its collector provides the reference current; a transistor with an emitter connected to the base of the reference transistor; and a voltage divider connecting the base of the reference transistor to the collector of the reference transistor, where the voltage divider includes a node connected to the base of the transistor. The voltage divider includes a first resistor connecting the base of the reference transistor to the base of the transistor and a second resistor connecting the base of the transistor to the collector of the reference transistor so that the connection of the first resistor to the second resistor defines the voltage divider node. Letting the first resistor have a resistance equal to $R_1$ ohms and the second resistor have a resistance equal to $R_2$ ohms, the transistor and the first and second resistors provide a voltage differential between the base of the reference transistor and the collector of the reference transistor substantially equal to $V_{BE}(1+R_2/R_1)$ volts when the emitter-base junction of the transistor is forward biased, where $V_{BE}$ is the base-emitter voltage of the transistor.

The present invention advantageously achieves a temperature compensated reference current by allowing the voltage drop between the base and collector of the reference transistor to be in a range of values having a greatest lower bound equal to $V_{BE}$. That is, the voltage differential $V_{BE}(1+R_2/R_1)$ is in the range $(V_{BE},\infty)$if we allow the possibility of $R_2=0$, otherwise, it is in the range $(V_{BE},\infty)$. Both $(V_{BE},\infty)$ and $(V_{BE},\infty)$ have $V_{BE}$ as its greatest lower bound. This allows temperature compensation for a greater range of supply voltages and temperature coefficients of resistors. The transistor and voltage divider also serve the function of a "beta-helper", so that the effect of the base current of the reference transistor upon the reference current is negligible.

It is a further advantage of the invention that the circuit topology lends itself to parametric trimming of resistors using a variety of methods to allow modification of the nominal reference current so as to compensate for variations in circuit parameters due to integrated circuit fabrication processes.

It is a further advantage of the present invention to achieve a temperature compensated reference current for a current mirror circuit in which only one transistor operates in a unified way as both a beta-helper transistor and as part of a $V_{BE}$ multiplier circuit.

DETAILED DESCRIPTION OF THE SPECIFIC EMBODIMENTS

Figure 4:
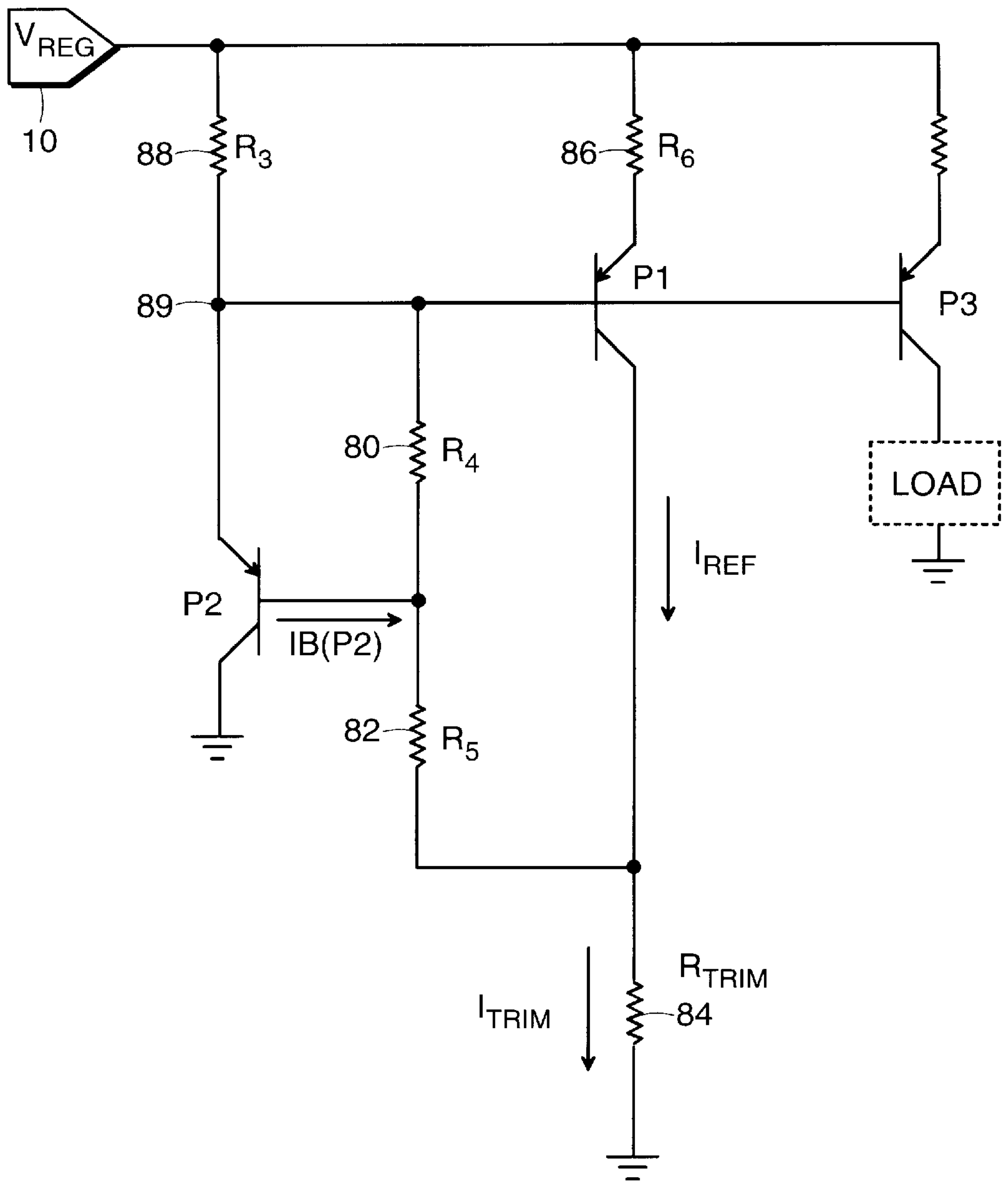
FIG. 4 shows an embodiment of the present invention employing pnp transistors for providing a temperature-compensated reference current.

FIG. 4 illustrates an embodiment in which a regulated voltage, $V_{reg}$, is applied to terminal 10 and the collector current of transistor P1, denoted as $I_{ref}$, is mirrored by transistor P3 into a load. Transistor P1 may be referred to as the reference transistor. Additional transistors may be connected in the same manner as transistor P3 is connected in order to mirror additional currents to additional loads. Transistor P2 and resistors 80 and 82 together combine the functions of a "beta-helper" circuit and a $V_{BE}$ multiplier circuit.

Performing a nodal current analysis at node A in FIG. 4, we obtain:

$$I_{ref}=I_{trim}-(V_{BE}\ (\mathbf{P2}))/R_4-I_B(\mathbf{P2}),$$

where $I_{trim}$ is the current flowing through resistor 84, $V_{BE}$ (P2) is the base-emitter voltage of transistor P2, $R_4$ is the resistance of resistor 80, and $I_B$(P2) is the base current of transistor P2. We shall assume that all base-emitter voltages in FIG. 4 are equal to each other, and we denote this voltage as $V_{BE}$. Also, assume that resistor 80 is chosen such that $I_B(\mathbf{P2})<<V_{BE}\ (\mathbf{P2}))/R_4$. Then, the above displayed equation for $I_{ref}$ reduces to $$I_{ref}=I_{trim}-V_{BE}/R_4 \qquad (1)$$

Performing a voltage analysis from terminal 10 to ground, and assuming that the emitter current of reference transistor P1 is equal to $I_{ref}$, we obtain $$V_{reg}-I_{ref}R_6-V_{BE}-V_{BE}(1+R_5/R_4)-I_{trim}R_{trim}=0, \qquad (2)$$

where $R_5$, $R_6$, and $R_{trim}$ are the resistances of resistors 82, 86, and 84, respectively. Combining equations (1) and (2) yields:

$$x\left[V_{BE}\left[\frac{1}{r}\frac{\partial r}{\partial T}\right]-\frac{\partial V_{BE}}{\partial T}\right]=V_{reg}\left[\frac{1}{r}\frac{\partial r}{T}\right],$$

Equation (3) provides the $V_{BE}$ multiplication desired for temperature compensation. Note that in equations (1) and (2) we have ignored the effects of the base current of transistor P2.

Figure 1A:
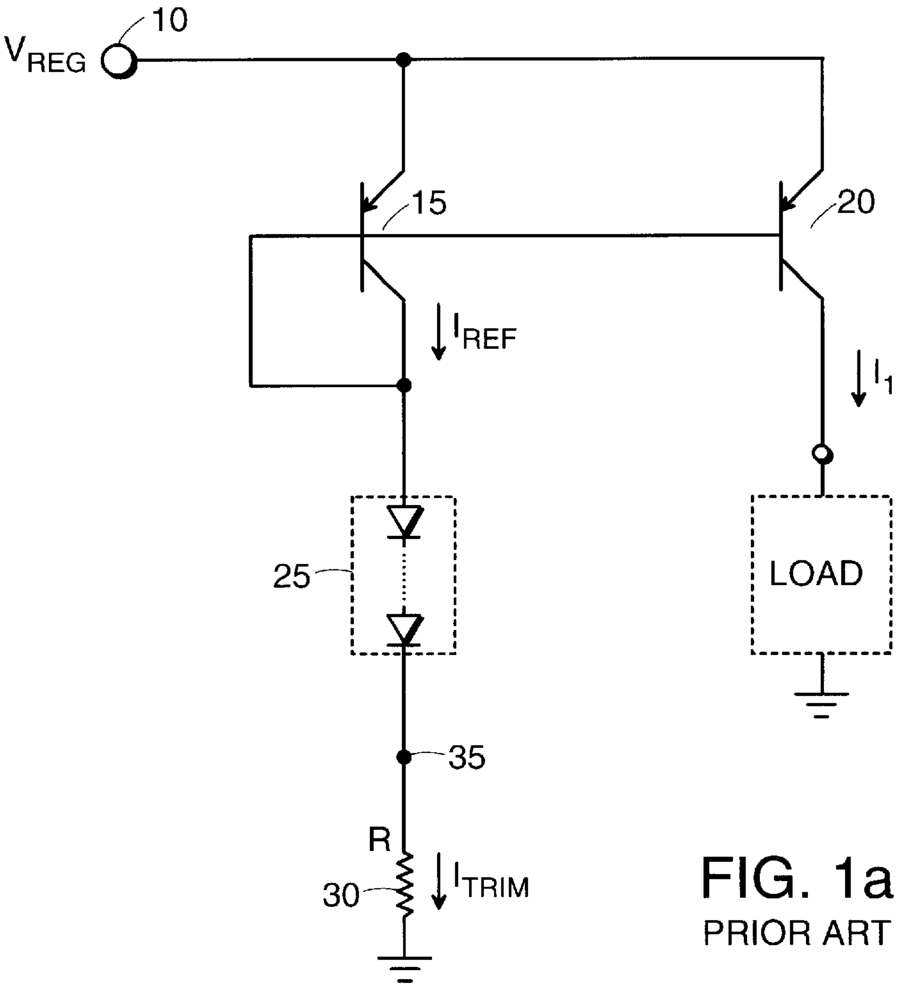
FIG. 1a PRIOR ART
FIGS. 1*a* and 1*b* show prior art current reference circuits.
Figure 1B:
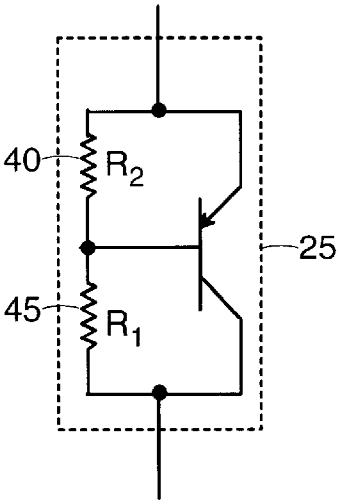
FIG. 1b PRIOR ART
Figure 2:
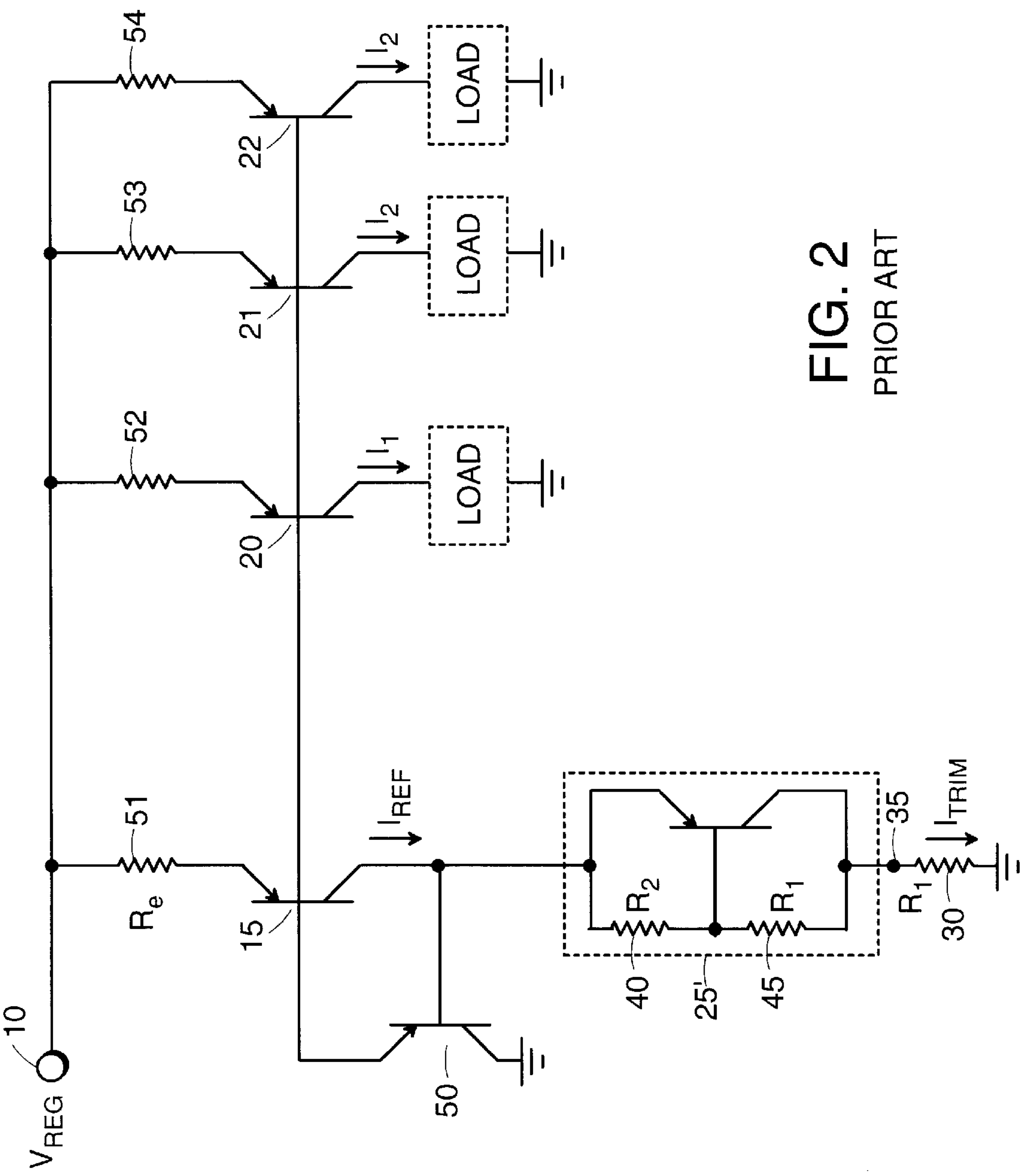
FIG. 2 PRIOR ART
FIG. 2 shows a prior art current reference circuit with a $V_{BE}$ multiplier circuit and a beta-helper transistor.
Figure 3:
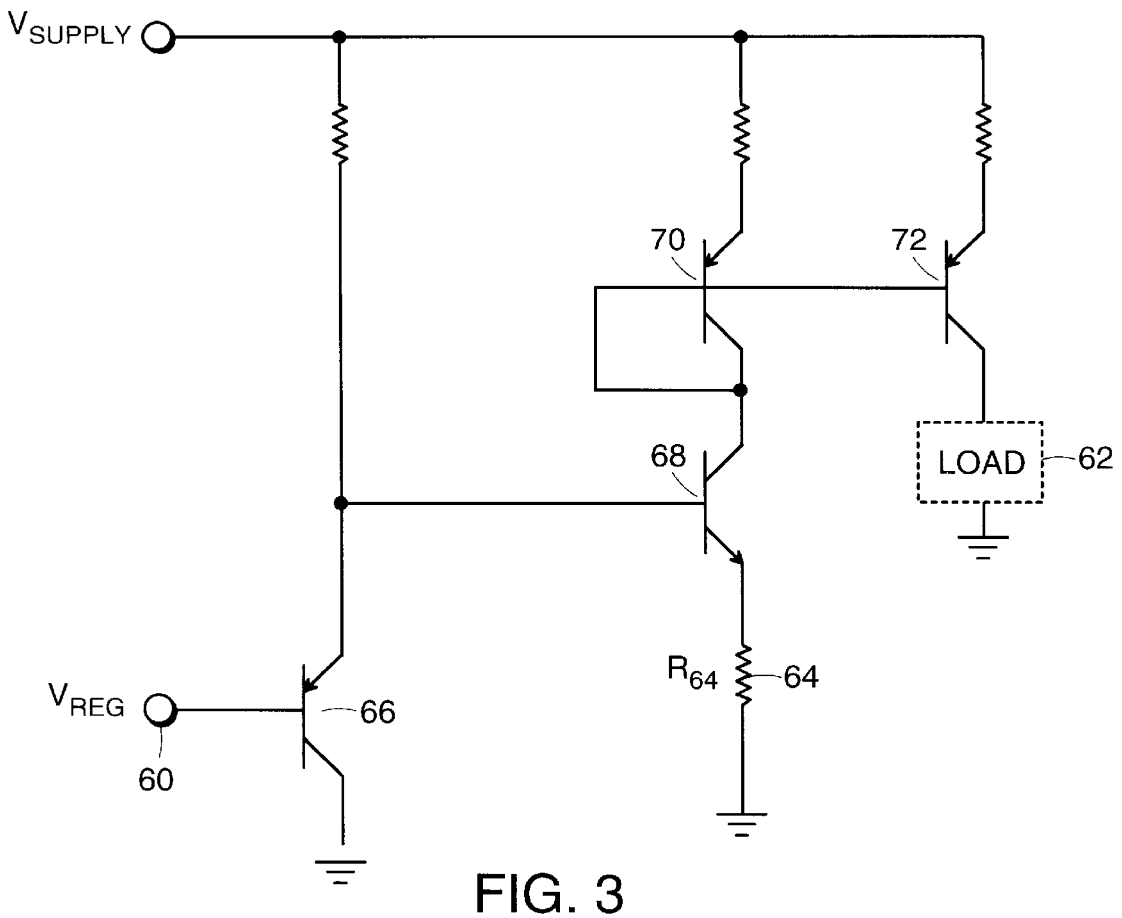
FIG. 3 PRIOR ART
FIG. 3 shows a prior art current reference circuit with $V_{BE}$ cancellation.

If in equation (3) we let $x=2+R_5/R_4+R_{trim}/R_4$ and let $r=R_{trim}+R_6$ then following the same analysis as was done for the circuit of FIG. 2, for temperature compensation x should be chosen such that:

$$I_{ref} = \frac{V_{reg} - V_{BE}(2 + R_5/R_4 + R_{trim}/R_4)}{R_{trim} + R_6} \tag{3}$$

and the circuit of FIG. 4 can provide for temperature compensation only if $$\frac{V_{reg}\left[\frac{1}{r}\frac{\partial r}{\partial T}\right]}{\left[V_{BE}\left[\frac{1}{r}\frac{\partial r}{\partial T}\right] - \frac{\partial V_{BE}}{\partial T}\right]} > 2.$$

The above expression shows that there will be some range of $V_{reg}$, $R_{trim}$, and $R_6$ for which embodiments of the present invention can provide for a temperature compensated reference current and for which the prior art cannot. That is, because the voltage drop from the $V_{reg}$ terminal to node A in FIG. 4 is lower bounded by $2V_{BE}$ whereas for the circuit in FIG. 2 it is lower bounded by $3V_{BE}$, the embodiment of the present invention allows for greater flexibility in temperature compensation.

The placement of transistor P2 provides a "beta-helper" function in that the base currents from the mirror transistors P1 and P2 (and other transistors if connected as mirrors) are not summed directly with the reference current $I_{ref}$, but are instead sunk to ground via transistor P2. The base current of transistor P2 is summed with the reference current, but this effect is small because the beta value of transistor P2 is relatively high, which is now discussed.

Resistor 88 serves as a pull-up resistor and provides current to the emitter of transistor P2 such that N/β is a small fraction of the emitter current of transistor P2. Assuming that the emitter currents of transistors P1 and P2 are equal to their respective collector current, it can be shown by considering the circuit loop consisting of resistor 88, the base-emitter of transistor Pl, and resistor 86 that the collector current of transistor P2, denoted by $I_C$(P2), is given by $$I_C(\mathbf{P2})=I_{ref}(R_6/R_3)+V_{BE}(1/R_3-1/R_4)+(N/\beta)I_{ref} \tag{4}$$

where β is the beta value of transistor P3 (and any other mirror transistors configured as transistor P3 which we assume all have the same beta value), $R_3$ is the resistance of resistor 88, and N is defined as the ratio of the total current mirrored by the mirror transistors of the circuit of FIG. 4 to the reference current $I_{ref}$. The value $R_3$ may be modified so that the temperature variation of $V_{BE}(1/R_3-1/R_4)$ cancels the temperature variation of $(N/\beta)I_{ref}$. Then, to first order, the collector current $I_C$(P2) will also be temperature compensated, so that the collector current can be passed through a resistor to generate a temperature compensated voltage (to the extent that the resistor is temperature compensated). Note that if $R_4$ is chosen to be equal to $R_3$, equation (4) reduces to $$I_C(\mathbf{P2})=I_{ref}(R_6R_3+N/\beta).$$

The base current of transistor P2 is given by $I_C$(P2)/β, where β is now the beta value of transistor P2. The effect of this error term on the derivation of equations (2) and (3) will result in a small error, typically on the order of one or two percent. Optimization of circuit design of FIG. 4 via simulation can compensate for this error term.

If emitter resistors are not used in the circuit of FIG. 4, then equation (3) reduces to $$I_{ref} = \frac{V_{reg} - V_{BE}(2 + R_5/R_4 + R_{trim}/R_4)}{R_{trim}}$$

and equation (4) reduces to $$I_C(\mathbf{P2})=V_{BE}(1/R_3-1/R_4)+(N/\beta)I_{ref},$$

Where again $R_3$ may be chosen so that the temperature variation of $V_{BE}(1/R_3-1R_4)$ cancels the temperature variation of $(N/\beta)I_{ref}$.

Although not shown in FIG. 4, alternative embodiments may have a resistor, diode, or both in series, connecting the collector of transistor P2 to ground. Furthermore, other variations of the $V_{BE}$ multiplier circuit of FIG. 4 may be used. The main characteristic of a $V_{BE}$ multiplier circuit important to an embodiment such as that illustrated in FIG. 4 is that the voltage difference presented by the $V_{BE}$ multiplier circuit to the base and collector of current mirror transistor P1 has a linear relationship to $V_{BE}$ (to first order in temperature) and that it also serves the function of a beta-helper circuit, and that the voltage difference can be in a range of values with greatest lower bound equal to $V_{BE}$.

Figure 5:
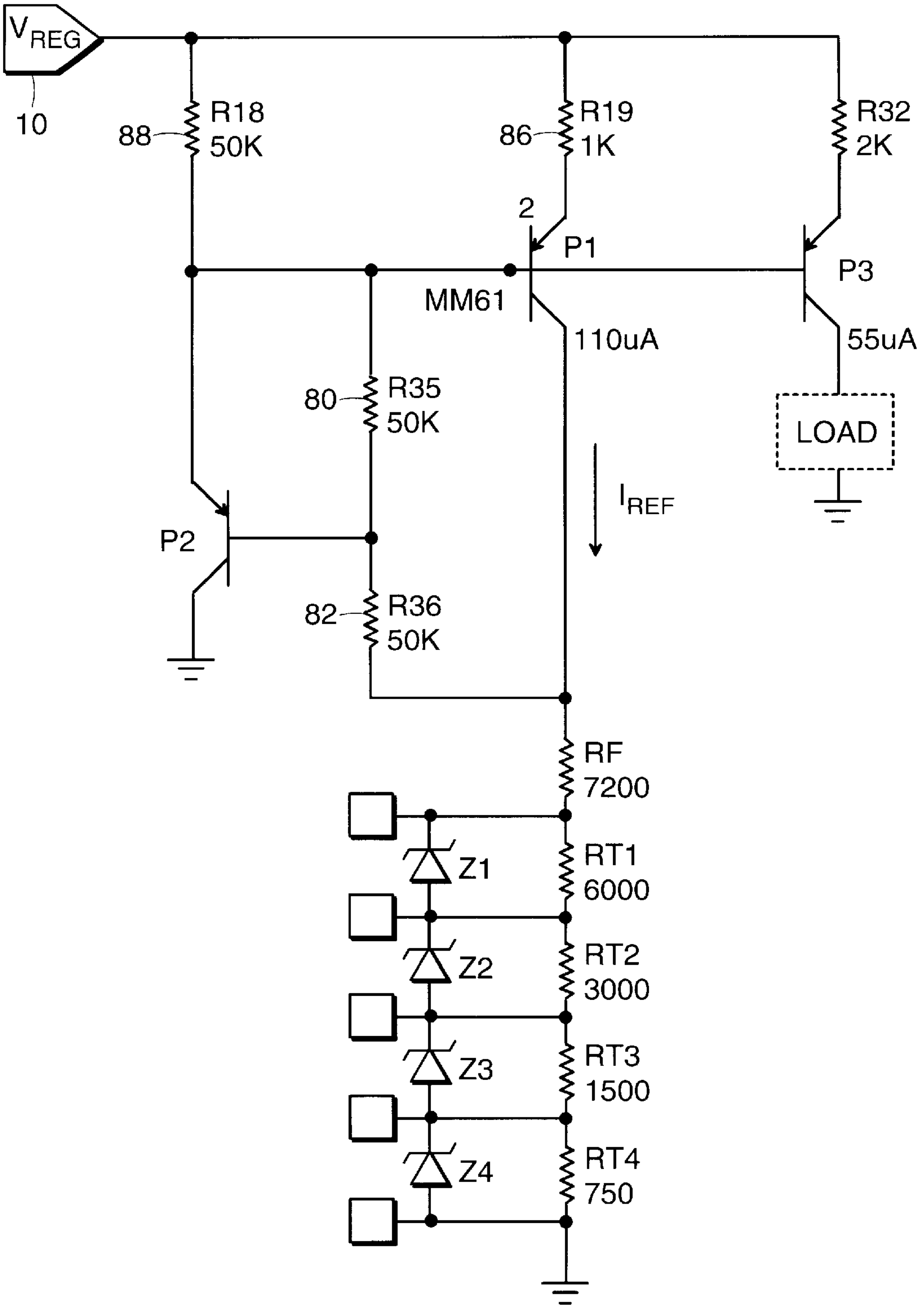
FIG. 5 is a modification of FIG. 4 in which trimming of a resistor is performed by following zener diodes.

Due to the natural variation in integrated circuit fabrication processing, it is unlikely that a current reference circuit as shown in FIG. 4 would be manufacturable within acceptable tolerances without correction circuitry. This correction is most easily performed by trimming. The embodiment in FIG. 4 lends itself to trimming of the reference current by trimming the value of resistor 84. This can be accomplished by a variety of methods, such as laser trimming or, fusible metal links, or "zener-zapping". An embodiment utilizing zener-zapping is shown in FIG. 5, along with nominal values for the resistors. Resistors RT1–RT4 are individually shorted by blowing one or more of zener diodes Z1–Z4.

Figure 6:
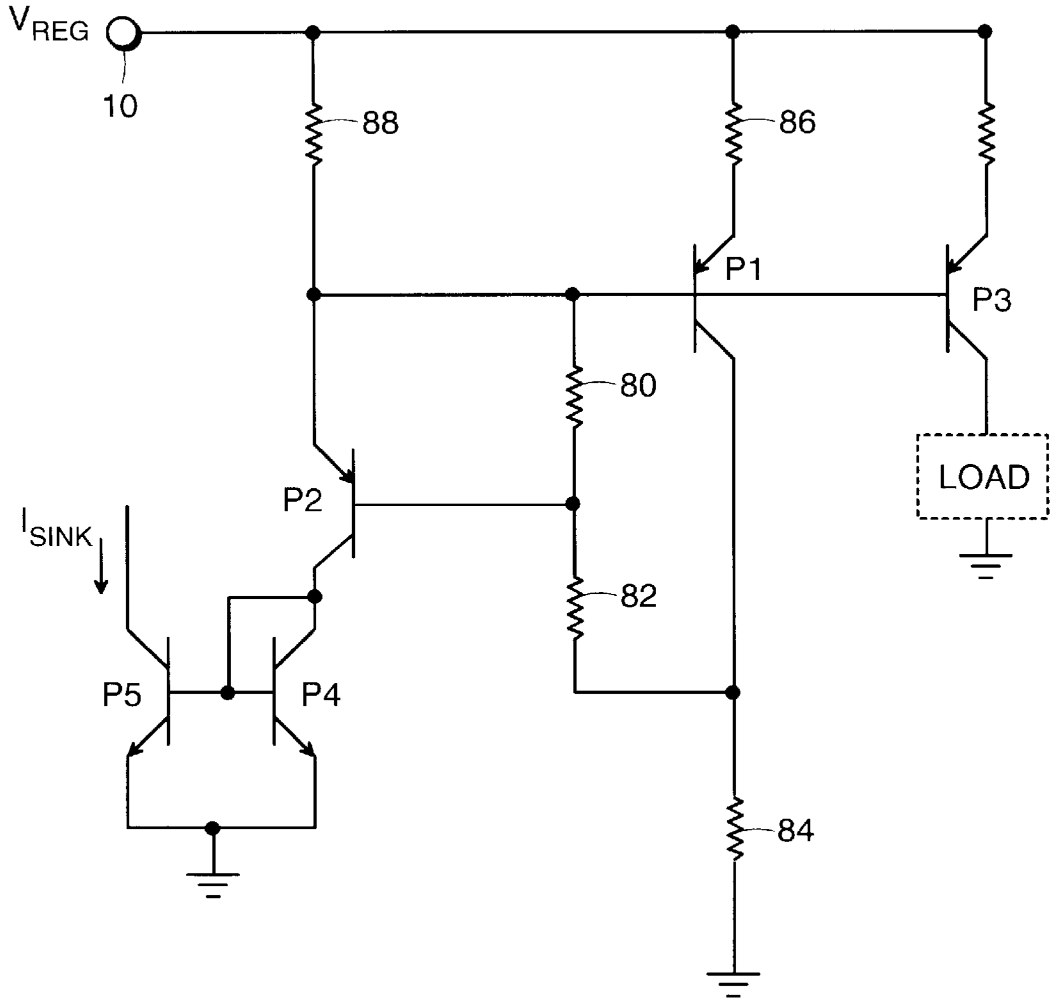
FIG. 6 is a modification of the embodiment of FIG. 4 in which the collector current of the beta-helper transistor of FIG. 4 is provided to another current mirror.

Another embodiment is shown in FIG. 6, in which the collector current of betahelper transistor P2 is mirrored by transistors P4 and P5 so that the current sunk by transistor P5, denoted by $I_{sink}$, is related to the collector current of transistor P2. Thus, $I_{sink}$ will be temperature compensated provided the collector current of transistor P2 is temperature compensated. Transistors P4 and P5 of FIG. 6 may have emitter resistors (not shown).

Figure 7:
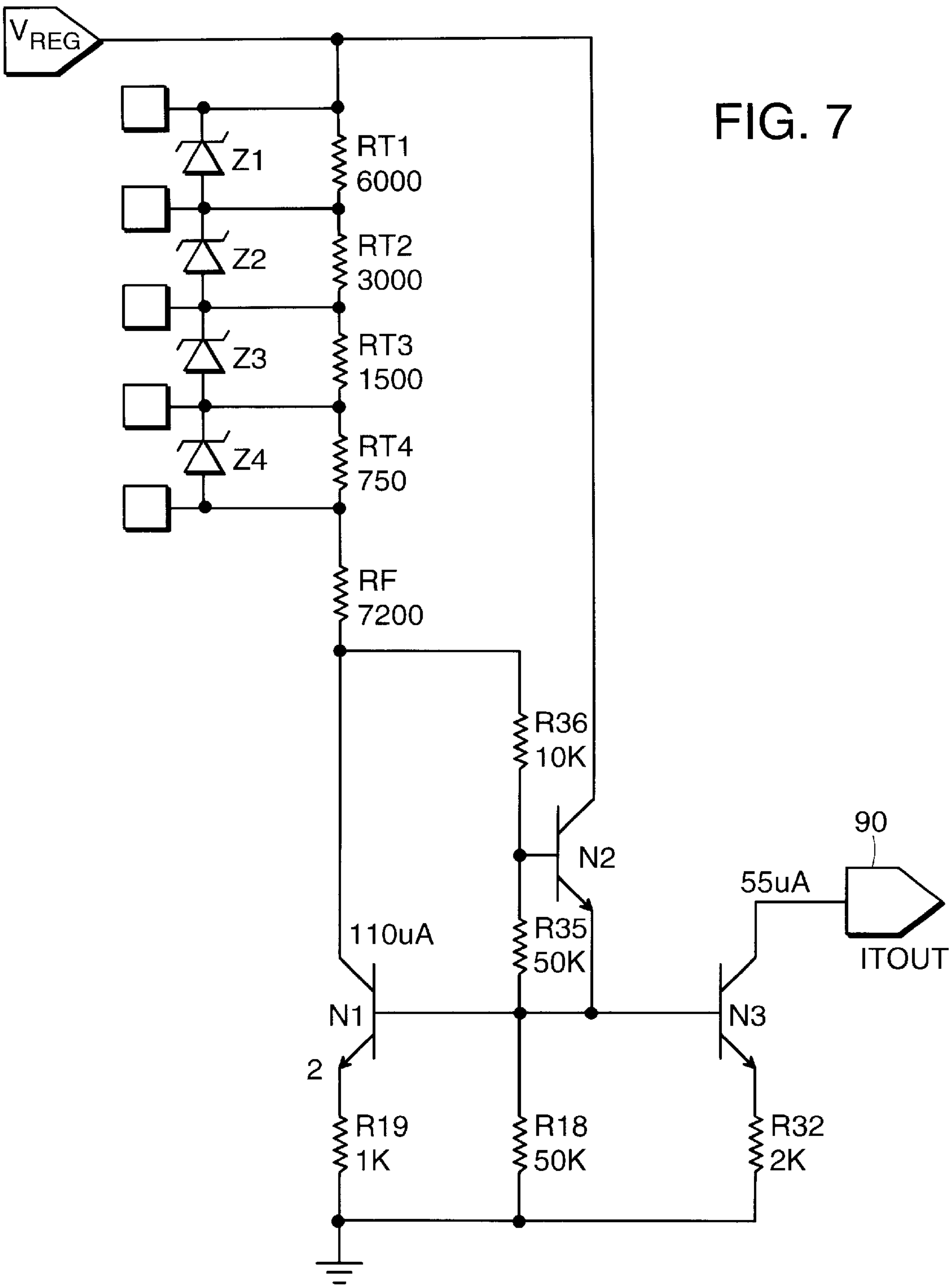
FIG. 7 is an alternative embodiment of the present invention employing npn transistors.

Shown in FIG. 7 is an embodiment in which all transistors are of npn type. The circuit in FIG. 7 functions in a similar way to the circuit of FIG. 5, in which transistor N2 and the voltage divider defined by resistors $R_{36}$ and $R_{35}$ serve the function of a $V_{BE}$ multiplier circuit and as a beta-helper. In the circuit of FIG. 7, current is sunk into terminal 90 from a load (not shown). Additional transistors may be configured to N3 to sink additional currents.

Modifications may be made to the various embodiments described herein without departing from the scope of the claimed invention.

What is claimed is:

1. A current reference circuit for providing a reference current, the current reference circuit comprising:

a reference transistor having a base and a collector to provide the reference current;

a transistor having a base and having an emitter connected to the base of the reference transistor; and a voltage divider connecting the base of the reference transistor to the collector of the reference transistor, the voltage divider including a node connected to the base of the transistor.

2. The circuit as set forth in claim 1, the transistor having an emitter-base junction with a forward-biased voltage drop of $V_{BE}$ volts, wherein the voltage divider includes a first resistor coupling the base of the reference transistor to the base of the transistor and a second resistor coupling the base of the transistor to the collector of the reference transistor so that the coupling of the first resistor to the second resistor defines the voltage divider node, the first resistor having a resistance equal to $R_1$ ohms, the second resistor having a resistance equal to $R_2$ ohms, wherein the transistor and the first and second resistors provide a voltage differential between the base of the reference transistor and the collector of the reference transistor substantially equal to $V_{BE}(1+R_2/R_1)$ volts when the emitter-base junction of the transistor is forward biased.

3. The circuit as set forth in claim 2, further comprising a third resistor connecting the emitter of the transistor to a first reference node.

4. The circuit as set forth in claim 3, further comprising a fourth resistor connecting the collector of the reference transistor to a second reference node.

5. A current reference circuit for providing a temperature compensated reference current, the current reference circuit comprising:

a first reference node to receive a voltage;

a current mirror coupled to the first reference node, the current mirror including a first pnp transistor having a base, an emitter, and a collector to provide the reference current;

a second pnp transistor having a base and having an emitter connected to the base of the first pnp transistor;

a first resistor connecting the base of the second pnp transistor to the base of the first pnp transistor;

a second resistor connecting the base of the second pnp transistor to the collector of the first pnp transistor; and a third resistor connecting the collector of the first pnp transistor to a second reference node; wherein the first reference node is held at a prescribed voltage higher than the second reference node to provide the reference current and the reference current is temperature compensated over a prescribed temperature range.

6. The current reference circuit as set forth in claim 5, further comprising a fourth resistor connecting the emitter of the second pnp transistor to the first reference node.

7. The current reference circuit as set forth in claim 6, further comprising an emitter resistor connecting the emitter of the first pnp transistor to the first reference node.

8. A current reference circuit for providing a temperature compensated reference current, the current reference circuit comprising:

a first reference node to receive a voltage;

a current mirror coupled to a second reference node, the current mirror including a first npn transistor having a base, an emitter, and a collector to provide the reference current;

a second npn transistor having a base and having an emitter connected to the base of the first npn transistor;

a first resistor connecting the base of the second npn transistor to the base of the first npn transistor;

a second resistor connecting the base of the second npn transistor to the collector of the first npn transistor; and a third resistor connecting the collector of the first npn transistor to the first reference node; wherein the first reference node is held at prescribed voltage higher than the second reference node to provide the reference current and the reference current is temperature compensated over a prescribed temperature range.

9. The current reference circuit as set forth in claim 8, further comprising a fourth resistor connecting the emitter of the second npn transistor to the second reference node.

10. The current reference circuit as set forth in claim 9, further comprising an emitter resistor connecting the emitter of the first npn transistor to second reference node.

11. A current mirror circuit to provide a reference current, the current mirror circuit comprising:

a reference transistor having a base with a base current and a collector to provide the reference current;

a transistor having an emitter, coupled to the base of the reference transistor, having an emitter current and having a base with a base current;

a first resistor coupling the emitter of the transistor to the base of the transistor, the first resistor having a current; and a second resistor coupling the base of the transistor to the collector of the reference transistor, such that when the reference transistor and transistor are forward biased a magnitude of a voltage difference between the base and collector of the reference transistor is in a range of values having a greatest lower bound equal to the base-emitter voltage drop of the transistor.

12. The current mirror as set forth in claim 11, wherein when the transistor and the reference transistor are forward biased the sum of the emitter current of the transistor and the current in the first resistor is greater than the base current of the reference transistor.

* * * * *